(12) United States Patent
Haruna et al.

(10) Patent No.: US 11,457,527 B2
(45) Date of Patent: Sep. 27, 2022

(54) SHIELD PRINTED WIRING BOARD AND METHOD OF MANUFACTURING SHIELD PRINTED WIRING BOARD

(71) Applicant: Tatsuta Electric Wire & Cable Co., Ltd., Osaka (JP)

(72) Inventors: Yuusuke Haruna, Kizugawa (JP); Shirou Yamauchi, Kizugawa (JP); Hiroshi Tajima, Kizugawa (JP); Sougo Ishioka, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 0 days.

(21) Appl. No.: 17/312,060

(22) PCT Filed: Dec. 12, 2019

(86) PCT No.: PCT/JP2019/048648
§ 371 (c)(1),
(2) Date: Jun. 9, 2021

(87) PCT Pub. No.: WO2020/122166
PCT Pub. Date: Jun. 18, 2020

(65) Prior Publication Data
US 2022/0030699 A1      Jan. 27, 2022

(30) Foreign Application Priority Data

Dec. 12, 2018   (JP) .............................. JP2018-232930

(51) Int. Cl.
*H05K 1/02*        (2006.01)
*H05K 1/11*        (2006.01)
*H05K 3/00*        (2006.01)

(52) U.S. Cl.
CPC ........... *H05K 1/0219* (2013.01); *H05K 1/115* (2013.01); *H05K 3/0094* (2013.01); *H05K 2201/05* (2013.01)

(58) Field of Classification Search
CPC ........ H05K 1/0219; H05K 1/115; H05K 1/02; H05K 1/03; H05K 1/0218; H05K 1/0216;
(Continued)

(56) References Cited

U.S. PATENT DOCUMENTS

2016/0183371 A1 * 6/2016 Su ........................... H05K 3/06
174/254
2017/0290145 A1   10/2017 Tajima et al.
2020/0045813 A1    2/2020 Tajima et al.

FOREIGN PATENT DOCUMENTS

JP          2004095566 A  *  3/2004
JP          2017059801 A     3/2017
(Continued)

OTHER PUBLICATIONS

English Machine Translation of Kawakami (JP2004095566A) provided with Office Action (Year: 2004).*

(Continued)

*Primary Examiner* — Roshn K Varghese
(74) *Attorney, Agent, or Firm* — United IP Counselors, LLC; Kenneth Fagin

(57) ABSTRACT

Provided is a shielded printed wiring board that exhibits excellent connection stability even when having a through-hole with a small opening area, and enables a high degree of freedom in circuit design. The shielded printed wiring board 1 according to the present invention includes a printed wiring board 10, an insulating layer 22, and a conductive adhesive layer 21 disposed between the printed wiring board 10 and the insulating layer 22. The printed wiring board 10 includes a base 11, a circuit pattern 13 disposed on the base, and an insulating protective layer 14 covering the circuit
(Continued)

pattern 13. The shielded printed wiring board has a through-hole 23 for external grounding that vertically penetrates the insulating layer 22 and the conductive adhesive layer 21. The conductive adhesive layer 21 has an extension 21*a* extending toward the inside of the through-hole 23 as compared with the insulating layer 22.

3 Claims, 3 Drawing Sheets

(58) Field of Classification Search
CPC ........ H05K 3/0094; H05K 3/00; H05K 3/022; H05K 2201/05; H05K 2201/0154; H05K 2201/035; H05K 2201/0715; H05K 9/00; H05K 9/0084; H05K 9/0083; H05K 9/0088; B32B 7/12; B32B 27/281; B32B 27/065; B32B 27/34
See application file for complete search history.

(56) References Cited

FOREIGN PATENT DOCUMENTS

| | | |
|---|---|---|
| JP | 2018041953 A | 3/2018 |
| JP | 2018110769 A | 7/2018 |
| TW | 201704412 A | 2/2017 |
| WO | 2016032006 A1 | 3/2016 |

OTHER PUBLICATIONS

International Search Report dated Feb. 25, 2020, issued in International Application No. PCT/JP2019/048648.
Written Opinion dated Feb. 25, 2020, issued in International Application No. PCT/JP2019/048648.
Taiwan Office Action issued in Taiwanese Patent Application No. 108145563 dated May 16, 2022.
Taiwan Search Report issued in Taiwanese Patent Application No. 108145563 dated May 16, 2022.

* cited by examiner

[FIG. 1]
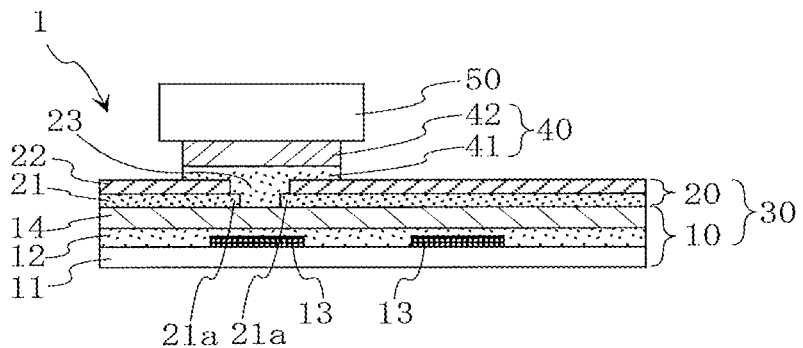
[FIG. 2]
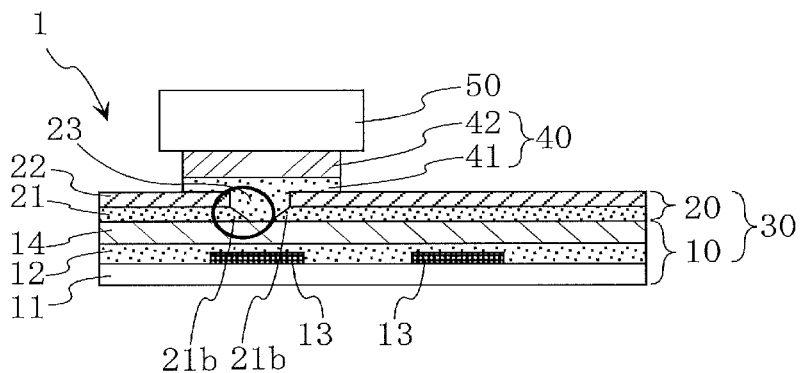
[FIG. 3]
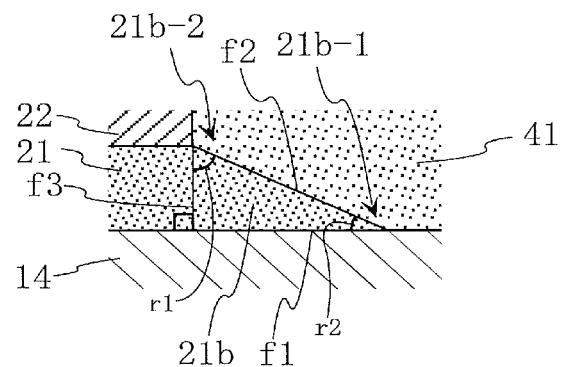

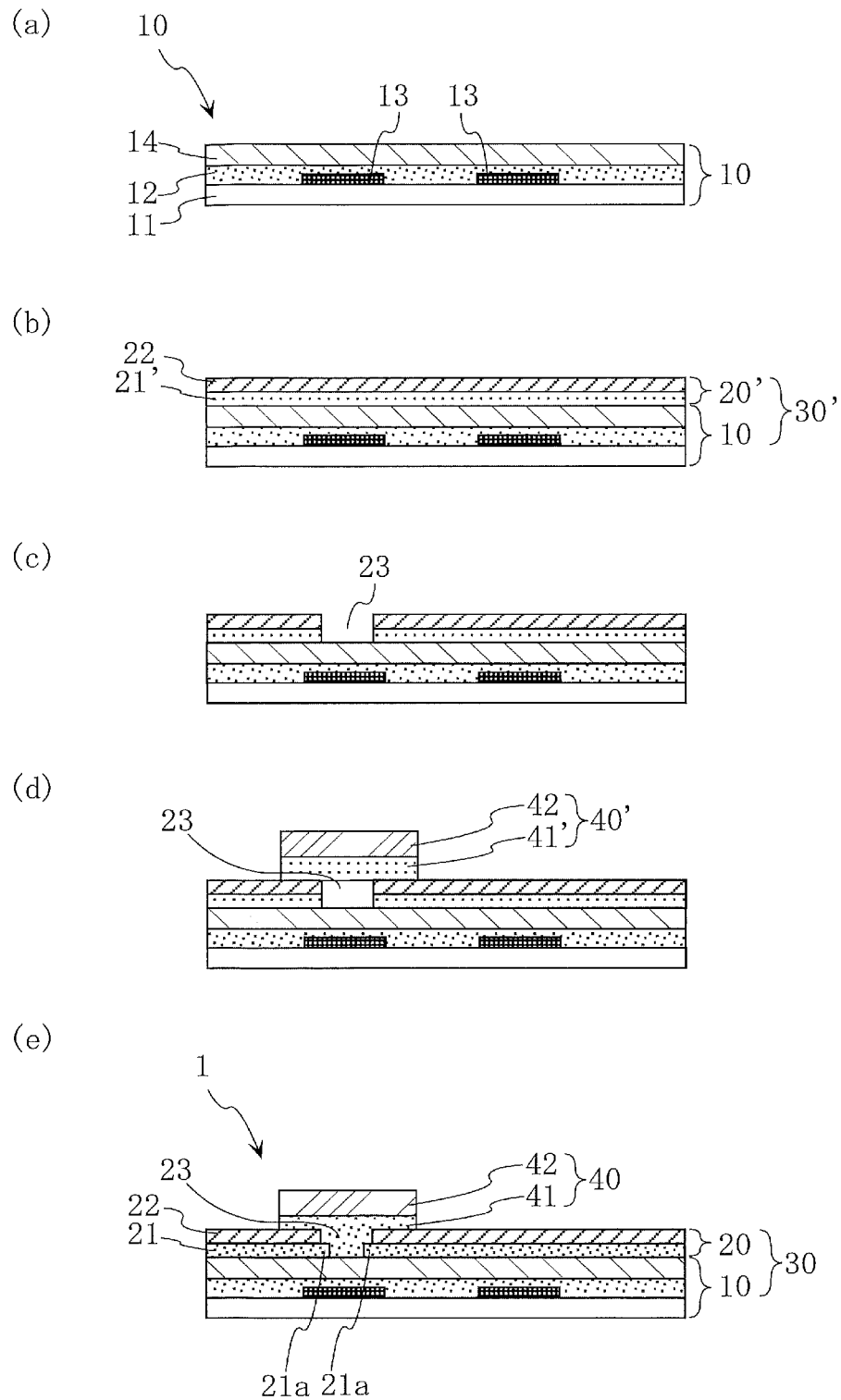

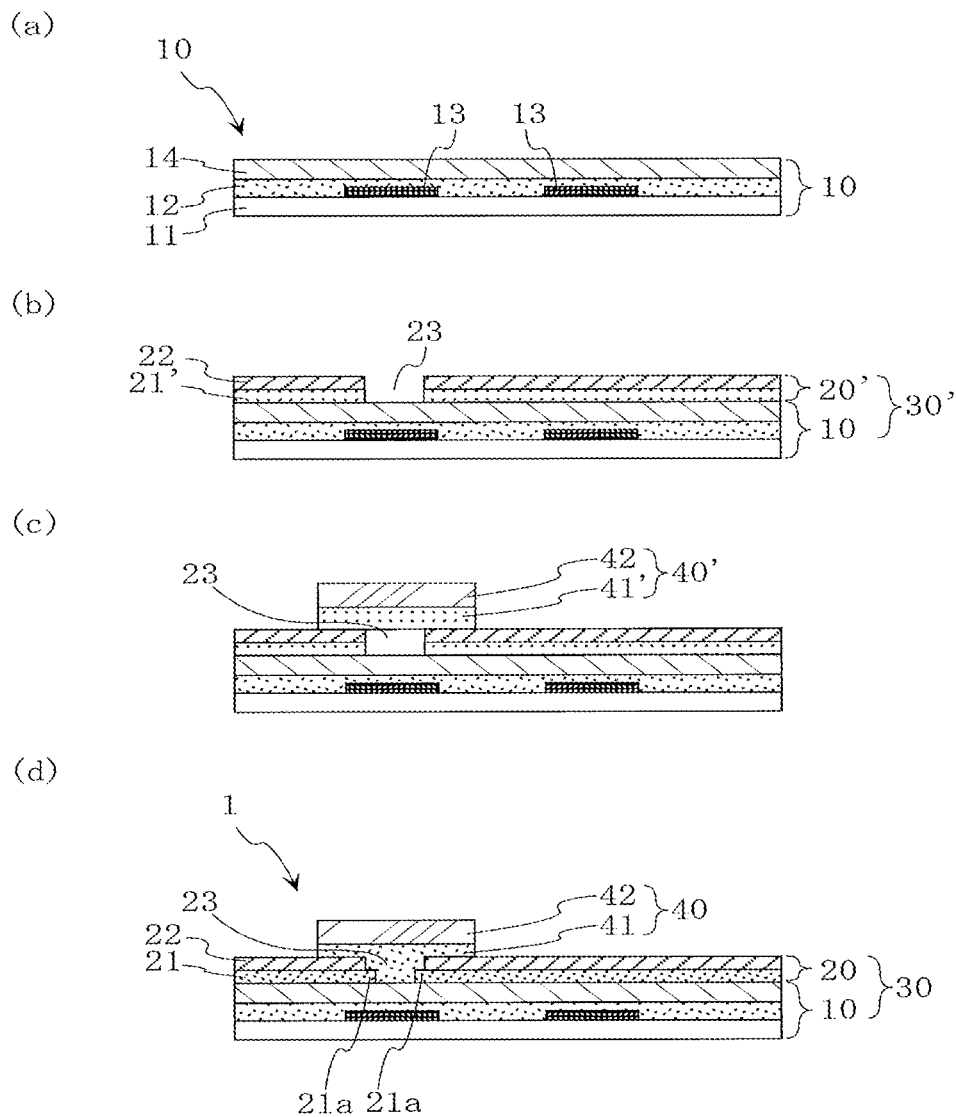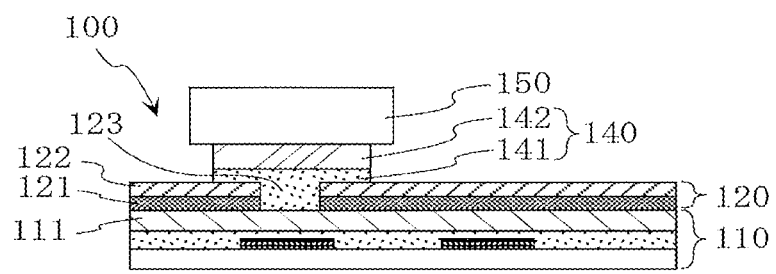

SHIELD PRINTED WIRING BOARD AND METHOD OF MANUFACTURING SHIELD PRINTED WIRING BOARD

TECHNICAL FIELD

The present invention relates to a shielded printed wiring board, and a method for manufacturing a shielded printed wiring board.

BACKGROUND ART

Printed wiring boards are heavily used in electronic devices such as cellular phones, video cameras, and laptop computers, to incorporate circuits into their mechanisms. The printed wiring boards are also used to couple movable elements such as printer heads to controllers. These electronic devices essentially require electromagnetic shielding measures, and shielded printed wiring boards, which have undergone electromagnetic shielding measures, are used as printed wiring boards in these devices.

An exemplary disclosed shielded printed wiring board is a substrate 100 with an electromagnetic shielding layer, as illustrated in FIG. 6 (see Patent Literature (PTL 1)). The substrate 110 has an electromagnetic shielding laminate 120 as the electromagnetic shielding layer. The electromagnetic shielding laminate 120 is disposed between a circuit board 110 and a grounding unit 140 coupled to an earthing unit 150 of an electronic device main body. The electromagnetic shielding laminate 120 includes an electromagnetic shielding layer 121 and an insulating layer 122 disposed in the specified sequence on an insulating protective film 111 of the circuit board 110. The electromagnetic shielding laminate 120 has a through-hole 123 penetrating the electromagnetic shielding layer 121 and the insulating layer 122. The grounding unit 140 includes a conductive adhesive layer 141 and a grounding connector 142 and is disposed on the topside of the through-hole 123. The electromagnetic shielding layer 121 and the insulating layer 122 lie on each other so as to electrically connect between the electromagnetic shielding layer 121 and the grounding unit 140 via the through-hole 123.

CITATION LIST

Patent Literature

PTL 1: Japanese Unexamined Patent Application Publication (JP-A) No. 2018-110769

SUMMARY OF INVENTION

Technical Problem

With recent increasing speed of signal transmission and miniaturization of devices, space between wiring (connections) becomes narrower, and this requires a high degree of freedom in circuit design. Such high speed transmission may invite electro magnetic interference (EMI), and demands are made to provide improved techniques for more effectively eliminating or minimizing the electro magnetic interference.

PTL 1 states that the disclosed electromagnetic shielding laminate ensures grounding and advantageously effectively contributes to higher reliability of grounding, because the electromagnetic shielding laminate allows conduction with the grounding connector via the through-hole that penetrates the electromagnetic shielding layer and the insulating layer.

In the substrate with an electromagnetic shielding layer disclosed in PTL 1, the conductive adhesive layer 141 of the grounding unit 140 requires physical contact with the electromagnetic shielding layer 121 and a conductive adhesive layer of the electromagnetic shielding laminate 120, to electrically connect with these layers. The through-hole 123 in the substrate with an electromagnetic shielding layer disclosed in PTL 1 requires a large opening area to surely stably connect between the grounding unit and the shielding film. However, such a larger opening area lowers the degree of freedom in circuit design.

The present invention has been made under these circumstances and has an object to provide a shielded printed wiring board that exhibits excellent connection stability even when having a through-hole with a small opening area, and enables a high degree of freedom in circuit design.

The present invention has another object to provide a method capable of easily manufacturing a shielded printed wiring board that exhibits excellent connection stability even when having a through-hole with a small opening area, and enables a high degree of freedom in circuit design.

Solution to Problem

After intensive investigations to achieve the objects, the inventors of the present invention have found that a specific shielded printed wiring board exhibits excellent connection stability even when having a through-hole with a small opening area, and enables a high degree of freedom in circuit design. This shielded printed wiring board bears an electromagnetic shielding film including a conductive adhesive layer and an insulating layer and having a through-hole penetrating the conductive adhesive layer and the insulating layer in a thickness direction (vertically). The electromagnetic shielding film has such a configuration that the conductive adhesive layer extends toward the inside of the through-hole as compared with the insulating layer. The present invention has been made on the basis of these findings.

Specifically, the present invention provides, in an embodiment, a shielded printed wiring board including a printed wiring board, an insulating layer, and a conductive adhesive layer disposed between the printed wiring board and the insulating layer. The printed wiring board includes a base, a circuit pattern disposed on the base, and an insulating protective layer covering the circuit pattern. The shielded printed wiring board has a through-hole for external grounding that penetrates the insulating layer and the conductive adhesive layer in a thickness direction. The conductive adhesive layer has an extension extending toward the inside of the through-hole as compared with the insulating layer.

The shielded printed wiring board according to the present invention includes the printed wiring board, the conductive adhesive layer, and the insulating layer. The shielded printed wiring board according to the present invention has the through-hole for external grounding that penetrates the insulating layer and the conductive adhesive layer in a thickness direction. The conductive adhesive layer has the extension extending toward the inside of the through-hole as compared with the insulating layer. The shielded printed wiring board according to the present invention has the extension as above. Thus, when the conductive adhesive layer is electrically connected to an external ground using an external-grounding connector, the shielded printed wiring board exhibits excellent connection stability even when the through-hole has a small opening area, because the contact area between a conductive material (electroconductive material) of the external-grounding connector and the conductive adhesive layer is large as compared with the case where such an extension is not provided. The shielded printed wiring board provides a high degree of freedom in circuit design because the through-hole can have a small opening area.

The angle formed between the extension underside and the extension topside at an ending edge of the extension is preferably an acute angle. Assume that the angle is an acute angle; and that the conductive material in the external-grounding connector undergoes thermocompression bonding and thereby flows into the through-hole. In this case, the conductive material is readily charged into the vicinity of the extension and the insulating protective layer. This eliminates or minimizes void formation in the conductive material charged in the through-hole. Such a void, if present, may blister and impair the connection (or bonding) between the conductive material and the shielding film when the shielded printed wiring board is heated in a downstream component mounting step (reflow process).

The angle formed between the extension topside and a plane perpendicular to the extension underside at a starting edge of the extension is preferably an acute angle. Assume that the angle is an acute angle; and that the conductive material in the external-grounding connector undergoes thermocompression bonding and flows into the through-hole. In this case, the conductive material is readily charged into the vicinity of the extension and the insulating layer. This eliminates or minimizes void formation in the conductive material charged in the through-hole. Such a void, if present, may blister and impair the connection (or bonding) of the conductive material with the shielding film and the grounding connector when the shielded printed wiring board is heated in the downstream component mounting step (reflow process).

The present invention also provides, in another embodiment, a method for manufacturing a shielded printed wiring board. The method includes a shielded printed wiring board main body preparation step, an external-grounding connector lamination step, and a thermocompression bonding step. The shielded printed wiring board main body preparation step prepares a shielded printed wiring board main body. The main body includes a printed wiring board having a circuit pattern, an insulating layer, and a conductive adhesive layer (i) disposed between the printed wiring board and the insulating layer. The main body has a through-hole for external grounding, where the through-hole penetrates the insulating layer and the conductive adhesive layer (i) in a thickness direction. The external-grounding connector lamination step places an external-grounding connector including a conductive adhesive layer (ii) on the topside of the through-hole so as to bring the conductive adhesive layer (ii) into contact with the shielded printed wiring board main body. The thermocompression bonding step performs thermocompression bonding, thereby extends the conductive adhesive layer (i) toward the inside of the through-hole as compared with the insulating layer, and allows the conductive adhesive layer (ii) to flow into the through-hole, to thereby bring the conductive adhesive layer (i) and the conductive adhesive layer (ii) into contact with each other.

The method according to the present invention for manufacturing a shielded printed wiring board includes the shielded printed wiring board main body preparation step, the external-grounding connector lamination step, and the thermocompression bonding step. The shielded printed wiring board main body preparation step is the step of preparing a shielded printed wiring board main body including a printed wiring board, a conductive adhesive layer (i), and an insulating layer. The shielded printed wiring board main body has a through-hole for external grounding that penetrates the insulating layer and the conductive adhesive layer (i) in a thickness direction. The external-grounding connector lamination step is the step of placing or stacking an external-grounding connector including an conductive adhesive layer (ii) on the topside of the through-hole, so that the conductive adhesive layer (ii) comes in contact with the shielded printed wiring board main body. The thermocompression bonding step is the step of performing thermocompression bonding, thereby extending the conductive adhesive layer (i) toward the inside of the through-hole, and allowing the conductive adhesive layer (ii) to flow into the through-hole. The thermocompression bonding step thus brings the conductive adhesive layer (i) and the conductive adhesive layer (ii) into contact with each other.

As including the thermocompression bonding step as above, the method according to the present invention for manufacturing a shielded printed wiring board allows the conductive adhesive layer (i) to soften and extend toward the inside of the through-hole and allows the conductive adhesive layer (ii) to soften and flow into the through-hole, by single thermocompression bonding. Thus, the method can easily manufacture the shielded printed wiring board having an extension. Accordingly, the method can easily manufacture a shielded printed wiring board that exhibits excellent connection stability even when having a through-hole with a small opening area, and enables a high degree of freedom in circuit design.

The conductive adhesive layer (i) preferably has a loss tangent of 0.1 to 0.7 at 150° C. The conductive adhesive layer (i), when having a loss tangent of 0.1 or more, can resist excessive extension upon thermocompression bonding. The conductive adhesive layer (i), when having a loss tangent of 0.7 or less, readily extends upon thermocompression bonding, and this contributes to easier manufacture of the shielded printed wiring board having an extension.

Advantageous Effects of Invention

The shielded printed wiring board according to the present invention exhibits excellent connection stability even when having a through-hole with a small opening area. The shielded printed wiring board enables free circuit design as compared with conventional shielded printed wiring boards. The method according to the present invention for manufacturing a shielded printed wiring board can easily manufacture a shielded printed wiring board that exhibits excellent connection stability even when having a through-hole with a small opening area, and enables a high degree of freedom in circuit design.

BRIEF DESCRIPTION OF DRAWINGS

FIG. 1 is a schematic cross-sectional view of a shielded printed wiring board according to an embodiment of the present invention;

FIG. 2 is a schematic cross-sectional view of a shielded printed wiring board according to another embodiment of the present invention;

FIG. 3 is an enlarged view of the vicinity of the extension 21b in FIG. 2;

FIG. 4 depicts schematic cross-sectional views of a method according to an embodiment of the present invention for manufacturing a shielded printed wiring board;

FIG. 5 depicts schematic cross-sectional views of a method according to another embodiment of the present invention for manufacturing a shielded printed wiring board; and FIG. 6 is a schematic cross-sectional view of an embodiment of a conventional shielded printed wiring board.

DESCRIPTION OF EMBODIMENTS

Shielded Printed Wiring Board

A shielded printed wiring board according to an embodiment of the present invention includes a printed wiring board, a conductive adhesive layer, and an insulating layer. The conductive adhesive layer lies between the printed wiring board and the insulating layer. The printed wiring board includes a base, a circuit pattern disposed on the base, and an insulating protective layer covering the circuit pattern. The shielded printed wiring board according to the present invention has a through-hole for external grounding, where the through-hole penetrates the insulating layer and the conductive adhesive layer in a thickness direction. The conductive adhesive layer has an extension extending toward the inside of the through-hole as compared with the insulating layer. Herein, the conductive adhesive layer in the electromagnetic shielding laminate is also referred to as a "conductive adhesive layer (I)".

A shielded printed wiring board according to one embodiment of the present invention will be illustrated below. FIG. 1 is a schematic cross-sectional view of the shielded printed wiring board according to one embodiment of the present invention.

As illustrated in FIG. 1, the shielded printed wiring board 1 includes a printed wiring board 10, a conductive adhesive layer (conductive adhesive layer (I)) 21, and an insulating layer 22. The conductive adhesive layer 21 lies between the printed wiring board 10 and the insulating layer 22. The shielded printed wiring board 1 has a through-hole 23 for external grounding that penetrates the insulating layer 22 and the conductive adhesive layer 21 in a thickness direction. The conductive adhesive layer 21 has an extension 21a extending toward the inside of the through-hole 23 as compared with the insulating layer 22. A multilayer assembly 20 composed of the insulating layer 22 and the conductive adhesive layer 21 and having the through-hole 23 is also referred to as an "electromagnetic shielding laminate". The shielded printed wiring board 1 further has an external-grounding connector 40 on or over the through-hole 23.

Printed Wiring Board

The printed wiring board 10 has a base 11, a circuit pattern 13, an insulating protective layer (cover lay) 14, and an adhesive layer 12. The circuit pattern 13 is provided partially on the base 11. The insulating protective layer 14 covers and insulatingly protects the circuit pattern 13. The adhesive layer 12 is for covering the circuit pattern 13 and bonding the circuit pattern 13 and the base 11 with the insulating protective layer 14. The circuit pattern 13 includes signal circuits.

The circuit pattern 13 is designed appropriately according to the intended use of the shielded printed wiring board. The circuit pattern 13 may further include one or more grounding circuits in addition to the signal circuits.

The base in the printed wiring board is selected appropriately according to the type of the printed wiring board, and is exemplified typically by rigid substrates, flexible substrates, and rigid-flexible substrates. Non-limiting examples of the rigid substrates include glass epoxy substrates, glass composite substrates, Teflon® substrates, and ceramic substrates.

Non-limiting examples of a material constituting the base include known or common engineering plastics such as poly(ethylene terephthalate)s, polypropylenes, crosslinked polyethylenes, polyesters, polybenzimidazoles, polyimides, polyimideamides, polyetherimides, and poly(phenylene sulfide)s. The base may be made of (or made from) each of different materials alone or in combination.

As the base, preferred are: polyester films from the viewpoint of cost; poly(phenylene sulfide) films from the viewpoint of excellent flame retardancy; and polyimide films, polyamide films, and glass epoxy films from the viewpoint of excellent heat resistance. The base preferably has a thickness of 5 to 100 µm, although the base may have any other thickness.

Examples of a material constituting the circuit pattern include, but are not limited to, conductive materials exemplified by metals such as Cu, Al, Au, Ag, Ni, Pd, Sn, Cr, W, Fe, and Ti; and alloys of two or more of these metals, such as special use stainless steels (SUSs).

The insulating protective layer is a layer that plays a role in protecting the circuit pattern, has insulation properties, and can undergo the after-mentioned thermocompression bonding step. Examples of the insulating protective layer include inorganic material films and organic material films. Non-limiting examples of materials constituting the inorganic material films include silicon oxide, silicon nitride, and nitrogen-containing silicon oxide. Non-limiting examples of materials constituting the organic material films include resins exemplified as the constituent materials for the base; and polybenzoxazoles. The insulating protective film may be composed of a single layer or multiple layers.

The adhesive layer may be made from any of known or common adhesive resins. Non-limiting examples of the adhesive resins include binder resins which will be exemplified as a binder resin for use in the after-mentioned conductive adhesive layer (I). The adhesive layer may be made from each of different adhesive resins alone or in combination.

Electromagnetic Shielding Laminate

The electromagnetic shielding laminate 20 includes the conductive adhesive layer 21 and the insulating layer 22, which lie in the specified sequence on the printed wiring board 10, more specifically, on the insulating protective layer 14 of the printed wiring board 10. The conductive adhesive layer 21 and the insulating layer 22 have the through-hole 23 penetrating them in a thickness direction (so as to expose a surface of the printed wiring board 10). The presence of the through-hole 23 allows contact and electric connection in the through-hole 23 between the conductive adhesive layer 21 and a conductive material 41 in the external-grounding connector 40. The printed wiring board 14 more specifically, the insulating protective layer 14, defines the bottom of the through-hole 23. Specifically, the through-hole 23 is defined by the side of the insulating layer 22, the top of the extension 21a, and the surface of the printed wiring board 14 (in particular, of the insulating protective layer 14).

The conductive adhesive layer 21 has the extension 21a extending toward the inside of the through-hole 23 as compared with the insulating layer 22. The extension 21a is a portion of the conductive adhesive layer 21 over which the insulating layer 22 does not exist. The top of the extension 21a is not covered by the insulating layer 22. Assume that the conductive adhesive layer 21 is electrically connected to the after-mentioned external ground 50 using the external-grounding connector 40. In this case, the presence of the extension 21a as described above gives a large contact area between the conductive material 41 and the conductive adhesive layer 21 in the external-grounding connector 40, as compared with the case where the conductive adhesive layer does not have such an extension 21a (for example, in the case of the substrate 100 with an electromagnetic shielding layer illustrated in FIG. 6). The configuration provides excellent connection stability even when the through-hole 23 has a small opening area (area of the through-hole 23 when seen from above). The configuration gives a high degree of freedom in circuit design, because the through-hole 23 can have a small opening area.

The extension may have any shape not limited. For example, the shape may be an annular shape (such as hollow cylindrical, hollow prismatic, or indeterminate hollow columnar shape) as of the extension 21a illustrated in FIG. 1; or a shape whose thickness (height) continuously or stepwise tapers off from the starting edge to the ending edge (such as a terrace shape or a step-wise shape), as of an extension 21b illustrated in FIG. 2; or any combination of these shapes. The thickness of the extension may be equal to, or smaller than, the thickness of a portion of the conductive adhesive layer 21 other than the extension.

The through-hole 23, in which the extension 21a as above is disposed, may have an approximately columnar shape (such as cylindrical, prismatic, or indeterminate columnar shape), where the shape is of a portion corresponding to the missing portion of the conductive adhesive layer 21. The through-hole 23, in which the extension 21b is disposed, may have such an approximately circular truncated conical shape that the side facing the insulating protective layer 14 defines an upper base.

As illustrated in FIG. 2, the angle formed by the upside and the topside of the extension at the ending edge of the extension (portion where extending of the conductive adhesive layer (I) toward the inside of the through-hole terminates) is preferably an acute angle, more preferably 70° or less, still more preferably 60° or less, and particularly preferably 45° or less. Assume that the angle is a right angle or an obtuse angle. In this case, when the conductive material in the external-grounding connector is charged into the through-hole, the conductive material may not be charged in the vicinity of the extension and the insulating protective layer at the ending edge, and this may cause void formation. The void may blister and impair the connection (or bonding) between the conductive material and the shielding film, upon heating of the shielded printed wiring board in a downstream component mounting step (reflow process).

The angle formed by the extension topside and a plane perpendicular to the extension underside at the starting edge of the extension (a portion where the extending of the conductive adhesive layer (I) toward the inside of the through-hole starts) is preferably an acute angle, more preferably 70° or less, still more preferably 60° or less, and particularly preferably 45° or less. Assume that the angle is a right angle or an obtuse angle. In this case, when the conductive material in the external-grounding connector is charged into the through-hole, the conductive material may not be charged in the vicinity of the extension and the insulating layer, and this causes void formation. The void may blister and impair the connection (or bonding) between the conductive material and the shielding film upon heating of the shielded printed wiring board in the downstream component mounting step (reflow process).

FIG. 3 depicts an enlarged view of the vicinity (circled portion in FIG. 2) of the extension 21b illustrated in FIG. 2. The extension 21b is an area defined by the underside f1 and the topside f2 of the extension, and the plane f3 perpendicular to the underside f1. The angle r2 formed by the extension underside f1 and the extension topside f2 at the ending edge 21b-1 of the extension 21b is an acute angle. The angle r1 formed by the extension topside f2 and the plane f3 perpendicular to the extension underside f1 at the starting edge 21b-2 of the extension 21b is an acute angle.

The opening of the through-hole may have any shape (shape of the through-hole when seen from above) not limited, and may have a shape such as a circular shape (e.g., true circular, or elliptic shape), or a polygonal shape (e.g., rectangular shape) as set as needed. The through-hole has an opening area of preferably 0.01 to 100 mm$^2$, more preferably 0.1 to 80 mm$^2$, and still more preferably 0.1 to 50 mm$^2$. The through-hole, when having an opening area within the range, can contribute to higher connection stability with the after-mentioned external ground 50 and higher electromagnetic shieldability. The opening, when being circular, has a diameter of preferably 0.5 to 5 mm, more preferably 0.5 to 3 mm, and still more preferably 0.8 to 3 mm.

The electromagnetic shielding laminate may have one, or two or more through-holes. The electromagnetic shielding laminate preferably has two or more through-holes from the viewpoint of providing still higher grounding.

The proportion of the opening area of the through-hole relative to the affixation area of the external-grounding connector is preferably 0.1% to 90%, and more preferably 1% to 70%. When the proportion is within the range, the conductive material in the external-grounding connector can have bond strength and grounding reliability at still higher levels.

Non-limiting examples of a technique for forming the extension include a technique of using an electromagnetic shielding laminate in which a through-hole has been formed and an extension has been disposed; and a technique of preparing an electromagnetic shielding film in which a through-hole has been formed without an extension, causing, by thermocompression bonding, the conductive adhesive layer to soften and flow toward the inside of the through-hole to form an extension. The through-hole in the electromagnetic shielding laminate may be formed before, or after, placing of the electromagnetic shielding laminate on the printed wiring board. The through-hole may be formed by a processing such as die cutting or laser beam machining.

The conductive adhesive layer (I) in the electromagnetic shielding laminate plays a role in eliminating or minimizing external leakage of electromagnetic waves emitted from the circuit pattern and in shielding the circuit from external electromagnetic waves (noise).

The conductive adhesive layer (I) preferably includes a binder resin and a conductive particle. The binder resin plays a role in binding other components to form a matrix in the conductive adhesive layer (I).

Non-limiting examples of the binder resin include thermoplastic resins, and cured products of thermosetting resins. Among them, cured products of thermosetting resins are preferred from the viewpoint of their excellent heat resistance in the reflow process. When the downstream process does not include a heating step such as reflow process, the binder resin is preferably selected from thermoplastic resins. The conductive adhesive layer (I) may include each of different binder resins alone or in combination.

Non-limiting examples of the thermosetting resins include phenolic resins, epoxy resins, urethane resins, melamine resins, and alkyd resins. Non-limiting examples of the thermoplastic resins include polystyrene resins, vinyl acetate resins, polyester resins, polyolefin resins (such as polyethylene resins and polypropylene resins), polyimide resins, polyamide resins, gum resins, and acrylic resins.

The binder resin is preferably selected from resins that can be softened by heat. This is because such a resin, when used as a component to constitute the conductive adhesive layer (I) and undergoing thermocompression bonding, readily flows and extends toward the inside of the through-hole. In addition, when the printed wiring board has a ground circuit, such a resin can easily flow and be charged into an opening formed in the insulating protective layer over the ground circuit.

Non-limiting examples of the conductive particle include metal particles, metal-coated resin particles, and carbon fillers. The conductive adhesive layer (I) may include each of different conductive particles alone or in combination.

Non-limiting examples of the metal constituting the metal particles and the metal constituting the coating of the metal-coated resin particles include gold, silver, copper, nickel, and zinc. Such a metal particle or a metal-coated resin particle may include, or be coated with, each of different metals alone or in combination.

Specifically, non-limiting examples of the metal particles include copper particles, silver particles, nickel particles, silver-coated copper particles, gold-coated copper particles, silver-coated nickel particles, gold-coated nickel particles, and silver-coated alloy particles. Examples of the silver-coated alloy particles include, but are not limited to, silver-coated copper alloy particles including copper-containing alloy particles (such as copper alloy particles made of an alloy among copper, nickel, and zinc) coated with silver. The metal particles can be prepared typically by electrolytic process, atomization, or reducing process.

Non-limiting examples of the shape of the conductive particle include spherical, flaky (squamous), dendritic, fibrous, and amorphous (polyhedral) shapes. In particular, the conductive particle preferably has a flaky shape, to allow the conductive adhesive layer (I) to have a lower resistance and better shield ability.

The insulating layer is situated toward the surface of the electromagnetic shielding laminate as compared with the conductive adhesive layer (I), and can thereby insulatingly protect the conductive adhesive layer (I) and eliminate or minimize electrical shorting upon contact with another conductive member. The insulating layer preferably includes a binder resin. Examples of the binder resin include those exemplified and described as the binder resin for use in the conductive adhesive layer (I). The insulating layer may include each of different binder resins alone or in combination.

The electromagnetic shielding laminate may further include a metal layer between the insulating layer and the conductive adhesive layer (I). When the electromagnetic shielding laminate has the metal layer, the through-hole penetrates the insulating layer, the metal layer, and the conductive adhesive layer (I). When the conductive material is charged into the through-hole to electrically connect the conductive adhesive layer (I) and the external-grounding connector so as to establish conduction therebetween, the metal layer acts as a foundation to reinforce the insulating layer. This enables more readily transition of pressure upon thermocompression bonding to the conductive material, accelerates the flowing of the conductive material, and enables more reliable conduction between the external-grounding connector and the conductive adhesive layer (I).

The electromagnetic shielding laminate may further include another layer in addition to the conductive adhesive layer (I) and the insulating layer. Non-limiting examples of the other layer include hardcoat layers, water vapor barrier layers, oxygen barrier layers, thermally conductive layers, low dielectric constant layers, high dielectric constant layers, and heat resistance-imparting layers.

External Grounding Connector

The external-grounding connector 40 includes a conductive material 41 and a grounding connector 42. The external-grounding connector 40 is disposed so as to block the opening of the through-hole 23 in the electromagnetic shielding laminate 20, to allow the conductive adhesive layer 21 and the conductive material 41 to contact and electrically connect with each other. The conductive material 41 is disposed to face the electromagnetic shielding laminate 20, fills the through-hole 23, and has the function of electrically connecting with the conductive adhesive layer 21 in the through-hole 23. The grounding connector 42 is disposed to face the external ground 50 and has the function of electrically connecting between the external ground 50 and the conductive material 41.

The conductive material is preferably a conductive adhesive layer. Herein, the conductive adhesive layer in the external-grounding connector is also referred to as a "conductive adhesive layer (II)".

The conductive adhesive layer (II) preferably includes a binder resin and a conductive particle. The binder resin plays a role in binding another component to form a matrix in the conductive adhesive layer (II).

The conductive adhesive layer (II) may include the conductive particle in a proportion of preferably 5 mass percent or more, and more preferably 40 mass percent or more, of the totality (100 mass percent) of the conductive adhesive layer (II), although the proportion is not limited. The proportion is preferably 95 mass percent or less, and more preferably 90 mass percent or less. The conductive adhesive layer (II), when containing the conductive particle in a proportion of 5 mass percent or more, exhibits good connection stability with the conductive material. The conductive adhesive layer (II), when containing the conductive particle in a proportion of 95 mass percent or less, exhibits good adhesion with the insulating protective layer of the printed wiring board.

Non-limiting examples of the binder resin include those exemplified and described as the binder resin for use in the conductive adhesive layer (I). The conductive adhesive layer (II) may include each of different binder resins alone or in combination. In particular, the binder resin is preferably selected from cured products of thermosetting resins, because such a thermosetting resin, when thermally cured by thermocompression bonding after filling the through-hole therewith, gives a cured product that can establish conduction with the conductive adhesive layer (I).

The binder resin is preferably selected from resins that soften by heat. This is because such a resin, when used as a component to form the conductive adhesive layer (II), fluidizes by thermocompression bonding and easily flows into and fills the through-hole.

Non-limiting examples of the conductive particle include those exemplified and described as the conductive particle for use in the conductive adhesive layer (I). The conductive adhesive layer (II) may include each of different conductive particles alone or in combination.

The conductive adhesive layer (II) may include a tackifier. Non-limiting examples of the tackifier include fatty acid hydrocarbon resins, C5/C9-mixed resins, rosin, rosin derivatives, terpene resins, aromatic hydrocarbon resins, and heat-reactive resins.

Non-limiting examples of the grounding connector includes metal sheets made of metals such as gold, silver, copper, aluminum, iron, and nickel, or alloys of two or more of these metals. Among them, preferred are copper, aluminum, nickel, and silver, from the viewpoints of conductivity, cost, and chemical stability as the grounding connector.

To form the shielded printed wiring board 1, a shielded printed wiring board main body 30 equipped with the external-grounding connector 40 is assembled according to design, and the conductive adhesive layer (I) 21 is connected through the conductive material 41 and the grounding connector 42 to the external ground 50 to establish grounding. The grounding connector 42 and the external ground 50 are coupled to each other through a gasket and a conductive pressure-sensitive adhesive sheet (each not shown).

External Ground

The external ground (earthing unit) 50 is a member having conductivity. Non-limiting examples of the external ground include a conductive board disposed within the electronic device main body, a metal plating of a cabinet, a metal sheet attached to the cabinet, and a lid or another member that is detachably configured.

The electronic device includes the shielded printed wiring board according to the present invention, which includes the external-grounding connector; and the external ground electrically connected to the external-grounding connector. The presence of the external-grounding connector strengthens grounding and allows the shielded printed wiring board main body to retain its shape. When the shielded printed wiring board is bent, the external-grounding connector having a certain area, as being affixed to the topside of the electromagnetic shielding laminate, restrains the dimensional resilience of the multilayer assembly and allows the assembly to retain its shape as being bent. Thus, the shielded printed wiring board according to the present invention is preferably a flexible printed wiring board (flexible printed circuit; FPC).

Method for Manufacturing Shielded Printed Wiring Board

A method according to an embodiment of the present invention for manufacturing a shielded printed wiring board includes a shielded printed wiring board main body preparation step, an external-grounding connector lamination step, and a thermocompression bonding step. The shielded printed wiring board main body preparation step is the step of preparing a shielded printed wiring board main body. The shielded printed wiring board main body includes a printed wiring board having a circuit pattern; an insulating layer; and a conductive adhesive layer (i) disposed between the printed wiring board and the insulating layer. The shielded printed wiring board main body has a through-hole for external grounding, where the through-hole penetrates the insulating layer and the conductive adhesive layer (i) in a thickness direction. The external-grounding connector lamination step is the step of laminating or stacking an external-grounding connector including a conductive adhesive layer (ii) on the topside of the through-hole, to bring the conductive adhesive layer (ii) into contact with the shielded printed wiring board main body. The thermocompression bonding step is the step of conducting thermocompression bonding to allow the conductive adhesive layer (i) to extend toward the inside of the through-hole as compared with the insulating layer, and to allow the conductive adhesive layer (ii) to flow into the through-hole; and whereby bringing the conductive adhesive layer (i) and the conductive adhesive layer (ii) into contact with each other. The method according to the present invention for manufacturing a shielded printed wiring board is also referred to as a "manufacturing method according to the present invention".

One embodiment of the manufacturing method according to the present invention will be illustrated with reference to FIG. 4.

Shielded Printed Wiring Board Main Body Preparation Step

The shielded printed wiring board main body preparation step prepares a shielded printed wiring board main body 30' typically as illustrated in FIG. 4C. The shielded printed wiring board main body 30' includes a printed wiring board 10 having a circuit pattern, an insulating layer 22, and a conductive adhesive layer (i) 21' disposed between the printed wiring board 10 and the insulating layer 22. The shielded printed wiring board main body 30' to be prepared has a through-hole 23 for external grounding, which penetrates the insulating layer 22 and the conductive adhesive layer (i) 21' in a thickness direction. Herein, such a shielded printed wiring board without an external-grounding connector (for example, the shielded printed wiring board 30 composed of the printed wiring board 10 and the electromagnetic shielding laminate 20; and the shielded printed wiring board 30' composed of the printed wiring board 10 and the electromagnetic shielding film 20') is also referred to as a "shielded printed wiring board main body". However, the shielded printed wiring board main body corresponds also to a shielded printed wiring board.

In one embodiment, the shielded printed wiring board main body preparation step initially prepares a printed wiring board 10 as illustrated in FIG. 4A. The printed wiring board 10 includes a base 11; a circuit pattern 13 disposed partially on the base 11; an insulating protective layer 14 that insulatingly protects the circuit pattern 13; and an adhesive layer 12 that covers the circuit pattern 13 and bonds the circuit pattern 13 and the base 11 to the insulating protective layer 14. Instead of the printed wiring board 10 illustrated in FIG. 4A, use may be made of a printed wiring board including a ground circuit in combination with a signal circuit as the circuit pattern 13, and a via formed in an insulating protective layer over the ground circuit. The via can be formed typically by laser beam machining. Alternatively, an insulating protective film in which such a via has been formed may be laminated.

Next, as illustrated in FIG. 4B, an electromagnetic shielding film 20' is stacked on the insulating protective layer 14 of the printed wiring board 10. The electromagnetic shielding film 20' is a multilayer assembly of a conductive adhesive layer (i) 21' and an insulating layer 22. When the insulating protective layer of the printed wiring board has a via, thermocompression bonding may be performed after stacking of the electromagnetic shielding film 20', to charge the conductive adhesive layer (i) 21' into the via. The thermocompression bonding is performed typically by pressurizing the electromagnetic shielding film with heating using a thermocompression bonding machine.

Next, as illustrated in FIG. 4C, a through-hole 23 is formed in the stacked electromagnetic shielding film 20' at a position corresponding to an area where an external-grounding connector will be affixed, so as to penetrate the conductive adhesive layer (i) 21' and the insulating layer 22. The through-hole 23 is formed typically by laser beam machining. The conductive adhesive layer (i) 21' will flow and cure upon thermocompression bonding in the after-mentioned thermocompression bonding step, to form a conductive adhesive layer (I) to thereby form an electromagnetic shielding laminate.

The conductive adhesive layer (i) has a loss tangent of preferably 0.1 to 0.7, and more preferably 0.1 to 0.4 at 150° C. When having a loss tangent of 0.1 or more, the conductive adhesive layer (i) can resist excessive extension upon thermocompression bonding. When having a loss tangent of 0.7 or less, the conductive adhesive layer may easily extend upon thermocompression bonding, and this enables easy manufacture of the shielded printed wiring board having an extension. The loss tangent at 150° C. can be determined typically by measurement of a sample at temperatures from 30° C. to 200° C. using a rheometer (trade name MCR302, supplied by Anton Paar GmbH). The measurement sample for use herein is prepared by shaping the conductive adhesive layer (i) into a disc having a diameter of 25 mm and a thickness of 1 mm. The measurement using the rheometer may be performed under conditions as follows:

Plate: D-PP25/AL/S07, diameter 25 mm
Oscillation angle: 0.1%
Frequency: 1 Hz
Measurement range: 30° C. to 200° C.
Temperature rise rate: 6° C./min The conductive adhesive layer (i) preferably includes a binder component and a conductive particle. Non-limiting examples of the binder component include the components to form the binder resin that may be contained in the conductive adhesive layer (I).

The binder component is preferably at least one of a thermoplastic res in and a thermosetting resin. The thermosetting resin is preferred from the viewpoint of excellent heat resistance in reflow process; whereas the thermoplastic resin is preferred when the method does not include a heating step such as reflow process in a downstream process. Non-limiting examples of the thermoplastic resin and the thermosetting resin include those exemplified and described as the thermoplastic resins and the thermosetting resins for use in the conductive adhesive layer (I). The conductive adhesive layer (i) may include each of different binder components alone or in combination.

Non-limiting examples of the conductive particle include those exemplified and described as the conductive particle that can be included in the conductive adhesive layer (I). The conductive adhesive layer (i) may include each of different conductive particles alone or in combination.

When including a thermosetting resin, the binder component may further include a curing agent (cross-linking agent) for accelerating a heat cure reaction, as a component constituting the binder component. The type of the curing agent may be selected appropriately according to the functional group of the thermosetting resin. Non-limiting examples of the curing agent include isocyanate curing agents, phenolic curing agents, imidazole curing agents, amine curing agents, and cationic curing agents. The binder component may include each of different curing agents alone or in combination.

External-Grounding Connector Lamination Step

The external-grounding connector lamination step places an external-grounding connector 40' including a conductive adhesive layer (ii) 41' on the topside of the through-hole 23, to bring the conductive adhesive layer (ii) 41' into contact with the shielded printed wiring board main body 30' (for example, with the insulating layer 22).

Specifically, the external-grounding connector 40' has been prepared by laminating the conductive adhesive layer (ii) 41' and the grounding connector 42 to give a laminate, and cutting the laminate to an optional size. Then, as illustrated in FIG. 4D, the external-grounding connector lamination step places the external-grounding connector 40' on the insulating layer 22 so that the conductive adhesive layer (ii) 41' blocks the opening of the through-hole 23.

Thermocompression Bonding Step

The thermocompression bonding step performs thermocompression bonding to allow the conductive adhesive layer (i) 21' to extend toward the inside of the through-hole 23 as compared with the insulating layer 22, and to allow the conductive adhesive layer (ii) 41' to flow into the through-hole 23. Thus, the conductive adhesive layer (i) 21' and the conductive adhesive layer (ii) 41' come into contact with each other.

Specifically, the thermocompression bonding step allows, by heating and compression, the conductive adhesive layer (i) 21' to soften and fluidize and to extend toward the inside of the through-hole 23 as compared with the insulating layer 22. The conductive adhesive layer (i) 21' then cures by subsequent cooling or thermal polymerization to form a conductive adhesive layer (I) 21. Thus, the electromagnetic shielding laminate 20 having the extension 21a is formed. In addition, the heating and compression also allows the conductive adhesive layer (ii) 41' to soften and fluidize, and the pressure upon the compression allows the conductive adhesive layer (ii) 41' to flow into and fill the through-hole 23. The conductive adhesive layer (ii) 41' then cures by the subsequent cooling or thermal polymerization to form a conductive adhesive layer (II) 41, to thereby form the external-grounding connector 40. Thus, the conductive adhesive layer (i) 21' and the conductive adhesive layer (ii) 41' flow or fluidize by thermocompression bonding and come into contact with each other. In the shielded printed wiring board 1 obtained by such thermocompression bonding, the contact between the conductive adhesive layer (I) 21 and the conductive adhesive layer (II) 41 provides electrical connection between the external-grounding connector 40 and the electromagnetic shielding laminate 20.

The extension of the conductive adhesive layer (i) toward the inside of the through-hole is significantly affected by the combination of the loss tangent of the conductive adhesive layer (i) and the thermocompression bonding conditions (such as pressure condition and temperature condition).

The conditions such as pressure, temperature, and time of the thermocompression bonding step can be selected appropriately according to the types of the conductive adhesive layer (i) and the conductive adhesive layer (ii) (in particular, the types of the binder component and the curing agent). The thermocompression bonding pressure is preferably 1 to 5 MPa, although the pressure is not limited. Assume that a thermosetting resin is used as the binder component. In this case, the thermocompression bonding temperature is preferably 140° C. to 200° C., although the temperature is not limited. Also assume that a thermosetting resin is used as the binder component. In this case, the thermocompression bonding time is preferably 1 to 60 minutes, although the time is not limited. However, when being flowable, the thermosetting resin may be cured before the thermocompression bonding.

Another embodiment of the manufacturing method according to the present invention will be illustrated with reference to FIG. 5.

The manufacturing method according to the other embodiment of the present invention illustrated in FIG. 5 differs from the embodiment illustrated in FIG. 4 in that the shielded printed wiring board main body preparation step places an electromagnetic shielding film 20' in which a through-hole 23 has been formed as illustrated in FIG. 5B, instead of placing the electromagnetic shielding film 20' having no through-hole as illustrated in FIG. 4B. In this embodiment, the through-hole is formed in the electromagnetic shielding film in a step or stage before the lamination of the electromagnetic shielding film on the printed wiring board. Accordingly, the through-hole can be formed not only by laser beam machining, but also by die cutting, which can be performed more easily, and this enables easier formation of the through-hole.

This embodiment is as with the embodiment of the manufacturing method according to the present invention illustrated in FIG. 4, except for the above configuration. The stage (step) of preparing the printed wiring board 10 illustrated in FIG. 5A, an external-grounding connector lamination step illustrated in FIG. 5C, and a thermocompression bonding step illustrated in FIG. 5D are respectively as with the step of preparing the printed wiring board 10 illustrated in FIG. 4A, the external-grounding connector lamination step illustrated in FIG. 4D, and the thermocompression bonding step illustrated in FIG. 4E.

The shielded printed wiring board according to the present invention can be manufactured by a procedure as above.

The manufacturing method according to the present invention allows, by thermocompression bonding, the conductive adhesive layer (I) to extend toward the inside of the through-hole as compared with the insulating layer, to form an extension, but does not include the step of forming such an extension by die cutting or machining. In addition, the manufacturing method enables formation of the extension and flowing of the conductive adhesive layer (ii) into the through-hole by single thermocompression bonding. Accordingly, the manufacturing method can easily manufacture the shielded printed wiring board according to the present invention. The manufacturing method according to the present invention can therefore easily manufacture such a shielded printed wiring board that exhibits excellent connection stability even when having a through-hole with a small opening area, and enables a high degree of freedom in circuit design.

REFERENCE SIGNS LIST 1 shielded printed wiring board
10 printed wiring board
11 base
12 adhesive layer
13 circuit pattern
14 insulating protective layer (cover lay)
20 electromagnetic shielding laminate
21 conductive adhesive layer (conductive adhesive layer (I))
22 insulating layer
23 through-hole
30 shielded printed wiring board (shielded printed wiring board main body)
40 external-grounding connector
41 conductive material
42 grounding connector
50 external ground
20' electromagnetic shielding film
21' conductive adhesive layer (i)
30' shielded printed wiring board (shielded printed wiring board main body)
40' external-grounding connector
41' conductive adhesive layer (ii)

The invention claimed is:

1. A shielded printed wiring board, comprising:
a printed wiring board;
an insulating layer; and
a conductive adhesive layer disposed between the printed wiring board and the insulating layer,
the printed wiring board including:
a base;
a circuit pattern disposed on the base; and
an insulating protective layer covering the circuit pattern,
the shielded printed wiring board having a through-hole for external grounding, the through-hole penetrating the insulating layer and the conductive adhesive layer in a thickness direction,
the conductive adhesive layer having an extension extending toward the inside of the through-hole as compared with the insulating layer, and
wherein an angle formed by an underside and a topside of the extension at an ending edge of the extension is an acute angle.

2. A shielded printed wiring board, comprising:
a printed wiring board;
an insulating layer; and
a conductive adhesive layer disposed between the printed wiring board and the insulating layer,
the printed wiring board including:
a base;
a circuit pattern disposed on the base; and
an insulating protective layer covering the circuit pattern,
the shielded printed wiring board having a through-hole for external grounding, the through-hole penetrating the insulating layer and the conductive adhesive layer in a thickness direction,
the conductive adhesive layer having an extension extending toward the inside of the through-hole as compared with the insulating layer, and
wherein an angle formed by a topside of the extension and a plane perpendicular to an underside of the extension at a starting end of the extension is an acute angle.

3. A method for manufacturing a shielded printed wiring board, the method comprising:
a shielded printed wiring board main body preparation step of preparing a shielded printed wiring board main body, the main body including:
a printed wiring board having a circuit pattern;
an insulating layer; and
a first conductive adhesive layer with a loss tangent of 0.1 to 0.7 at 150° C. disposed between the printed wiring board and the insulating layer,
the main body having a through-hole for external grounding, the through-hole penetrating the insulating layer and the first conductive adhesive layer in a thickness direction;
an external-grounding connector lamination step of placing an external-grounding connector including a second conductive adhesive layer on a topside of the through-hole so as to bring the second conductive adhesive layer into contact with the shielded printed wiring board main body; and
a thermocompression bonding step of performing thermocompression bonding, thereby allowing the first conductive adhesive layer to extend toward the inside of the through-hole as compared with the insulating layer, and allowing the second conductive adhesive layer to flow into the through-hole, and whereby bringing the first conductive adhesive layer and the second conductive adhesive layer into contact with each other.

* * * * *